United States Patent
Tsorng et al.

(10) Patent No.: US 11,635,791 B2
(45) Date of Patent: Apr. 25, 2023

(54) SYSTEM AND METHOD FOR ASSEMBLING MULTIPLE HOUSING ROWS FOR COMPUTER COMPONENTS

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Jui-Tang Chang, Taoyuan (TW); Guan-Kai Lien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 66 days.

(21) Appl. No.: 17/005,728

(22) Filed: Aug. 28, 2020

(65) Prior Publication Data

US 2022/0066518 A1    Mar. 3, 2022

(51) Int. Cl.
  *G06F 1/16*    (2006.01)
  *G06F 1/18*    (2006.01)
  *H05K 5/02*    (2006.01)

(52) U.S. Cl.
  CPC ........... *G06F 1/181* (2013.01); *H05K 5/0217* (2013.01)

(58) Field of Classification Search
  CPC .............................. G06F 1/181; H05K 5/0217
  USPC ....................................................... 312/348.3
  See application file for complete search history.

(56) References Cited

U.S. PATENT DOCUMENTS

| | | | | |
|---|---|---|---|---|
| 6,266,250 B1* | 7/2001 | Foye | ...................... | H02B 1/043 248/220.21 |
| 6,853,548 B2* | 2/2005 | Vanderheyden | ..... | G11B 33/128 |
| 8,582,301 B2* | 11/2013 | Fan | ......................... | G06F 1/188 248/200 |
| 2003/0112596 A1* | 6/2003 | Shih | ...................... | G11B 33/128 |
| 2008/0013273 A1* | 1/2008 | Bailey | ...................... | G06F 1/185 361/679.33 |
| 2008/0310123 A1* | 12/2008 | Sherrod | ............... | H05K 7/1488 361/725 |
| 2010/0238618 A1* | 9/2010 | Chang | ................... | G11B 33/127 361/679.4 |
| 2012/0169188 A1* | 7/2012 | Fan | ...................... | G11B 33/128 312/223.1 |
| 2012/0314357 A1* | 12/2012 | Li | ........................ | H05K 7/1489 361/679.4 |
| 2013/0265714 A1* | 10/2013 | Tsao | ..................... | H05K 7/1487 361/679.01 |

(Continued)

*Primary Examiner* — James O Hansen
(74) *Attorney, Agent, or Firm* — Nixon Peabody LLP

(57) ABSTRACT

A partition for separating computer components in an apparatus holding the computer components is provided. The partition includes a body with a first side and a second side; one or more top tabs projecting from both the first side and the second side of the body; one or more bottom tabs projecting from the first side of the body; and one or more bottom protrusions projecting from the second side of the body. The one or more top tabs are secured in a first manner, e.g., through rivets, to a first panel of the apparatus. The one or more bottom tabs are secured in the first manner to a second panel of the apparatus. The one or more bottom protrusions are secured in a second manner to the second panel of the apparatus, e.g., tucking a protrusion under the second panel. The features allow different-sized compartments for different storage form factors.

14 Claims, 18 Drawing Sheets

(56) References Cited

U.S. PATENT DOCUMENTS

2015/0293566 A1\* 10/2015 Ehlen ................... H05K 7/1489
                                                        361/679.33
2018/0116067 A1\* 4/2018 Good ................... A47B 88/975

\* cited by examiner

SYSTEM AND METHOD FOR ASSEMBLING MULTIPLE HOUSING ROWS FOR COMPUTER COMPONENTS

TECHNICAL FIELD

The present disclosure relates generally to systems and methods for constructing a housing for computer components. More particularly, aspects of this disclosure relate to designs of partitions and cages forming a scaffold that supports different sized storage drives of a server.

BACKGROUND

Computing systems (e.g., desktop computers, blade servers, rack-mount servers, etc.) are employed in large numbers in various applications. Computer servers are typically designed to house multiple components of a same type, for example, multiple processors, multiple memory modules, multiple hard drives, multiple fans, etc. Since multiple components of the same type can be installed in a computer server, computer server designers typically organize components within a blade server or a rack-mount server systematically. Thus, memory modules within a blade server are found in a same location; hard drives for the server are found in a same location; and processors are found in a same location. This systematic approach has the advantage of providing an intuitive layout for the blade server or the rack-mount server.

When considering a layout of a server, individual processor modules and memory modules take up a smaller volume compared to that required by individual hard drives. As such, technology that reduces cross sectional area and/or volume of hard drives have had impact on server architecture. For example, a 3.5-inch hard disk drive (HDD) has a larger length, a larger height, and a larger width when compared to a 2.5-inch HDD. The 2.5-inch HDD form factor is newer than the 3.5-inch HDD form factor. Other larger form factors exist but have become obsolete in today's HDD market.

A server designer may want to house as many HDDs as physically possible in a server. 2.5-inch HDDs have a size advantage compared to 3.5-inch HDDs, which can allow a larger number of 2.5-inch HDDs to be integrated in a server. On the other hand, 3.5-inch HDDs have a capacity advantage and can store almost twice as much information compared to 2.5-inch HDDs. This advantage of 3.5-inch HDDs has made them viable in an era where miniaturization is the trend.

New storage technology form factors are currently under development. For example, a solid state drive (SSD) or a hybrid drive can be packaged in the 2.5-inch HDD form factor. An SSD or a hybrid drive can be packaged in a smaller form factor (e.g., a Ruler SSD), or an SSD can forgo the packaging and be directly mounted in a server expansion slot (e.g., an M.2 slot). When new form factors are introduced, design and manufacturing processes for servers may change to accommodate the new form factors. The new form factors may allow higher integration of hard drives, thus limiting amount of space previously available for installing bolts or fasteners in a cage which receives the hard drives. Thus, the present disclosure is directed at addressing problems associated with assembling cages for use in servers that use a smaller form factor hard drive.

SUMMARY

Some implementations of the present disclosure provide a partition for separating computer components in an apparatus holding the computer components. The partition includes a body with a first side and a second side; one or more top tabs projecting from both the first side and the second side of the body; one or more bottom tabs projecting from the first side of the body; and one or more bottom protrusions projecting from the second side of the body. The one or more top tabs are secured in a first manner to a first panel of the apparatus. The one or more bottom tabs are secured in the first manner to a second panel of the apparatus. The one or more bottom protrusions are secured in a second manner to the second panel of the apparatus. The first manner is different from the second manner.

In an embodiment, a respective bottom tab of the one or more bottom tabs includes a hole for securing the respective bottom tab to the second panel. The hole facilitates securing the respective bottom tab to the second panel in the first manner. In an embodiment, the first manner includes securing the one or more top tabs and the one or more bottom tabs using rivets. In an embodiment, the second manner includes tucking a respective bottom protrusion under a portion of the second panel. In an embodiment, the partition further includes one or more vents. At least one of the vents has a polygonal shape or a circular shape.

In an embodiment, the partition further includes one or more side contours. The one or more side contours provide additional contact points between the first side of the body and the second side of the body. In an embodiment, each of the one or more side contours facilitates airflow between the first side of the body and the second side of the body, such that air flows through at least one of the side contours.

Some implementations of the present disclosure provide a cage panel in an apparatus holding computer components. The cage panel is operable to form a cage with partitions to hold the computer components. The cage panel includes a plurality of overhanging regions and a plurality of first recessed regions. A respective first recessed region of the plurality of first recessed regions includes one or more holes for securing a first partition. The cage panel further includes a plurality of stoppers. A respective stopper is configured to restrict motion of the first partition in a single direction by engaging a protrusion of the partition when the protrusion is tucked underneath a respective overhanging region.

In an embodiment, the first recessed regions are arranged in a first row and a second row, such that the first partition is secured to the cage panel at one first recessed region in the first row, and one first recessed region in the second row. In an embodiment, the cage panel further includes a plurality of second recessed regions proximate to a first set of stoppers. The plurality of second recessed regions provides access to some of the plurality of overhanging regions of the cage panel. In an embodiment, the respective first recessed region and the respective stopper are positioned on opposite sides of the first partition.

Some implementations of the present disclosure provide an apparatus for holding computer components. The apparatus includes a plurality of cage panels and a plurality of partitions. The cage panels include a first cage panel and a second cage panel. A respective partition includes a body with a first side and a second side. The respective partition further includes one or more top tabs projecting from both the first side and the second side of the body. The respective partition further includes one or more bottom tabs projecting from the first side of the body. The respective partition further includes one or more bottom protrusions projecting from the second side of the body. The one or more top tabs are secured in a first manner to the first cage panel of the apparatus. The one or more bottom tabs are secured in the first manner to the second cage panel of the apparatus. The one or more bottom protrusions are secured in a second manner to the second cage panel of the apparatus. The first manner is different from the second manner.

In an embodiment, the first cage panel and the second cage panel are separated by the partitions. In an embodiment, the cage panels further include a third cage panel. The partitions are arranged in a first row and a second row. The first row is defined by the first cage panel and the second cage panel. The second row is defined by the second cage panel and the third cage panel. In an embodiment, a respective bottom tab of the in the respective partition includes a hole for securing the bottom tab to the second cage panel. The hole facilitates securing the respective bottom tab to the second panel in the first manner. In an embodiment, the second manner includes tucking a respective bottom protrusion in the respective partition under a portion of the second panel.

In an embodiment, the respective partition further includes one or more vents. At least one of the vents has a polygonal shape or a circular shape. In an embodiment, the respective partition further includes one or more side contours. The one or more side contours provide additional contact points between the first side of the body and the second side of the body. In an embodiment, each of the one or more side contours facilitates airflow between the first side of the body and the second side of the body, such that air flows through at least one of the side contours. In an embodiment, the body is U-shaped.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1:
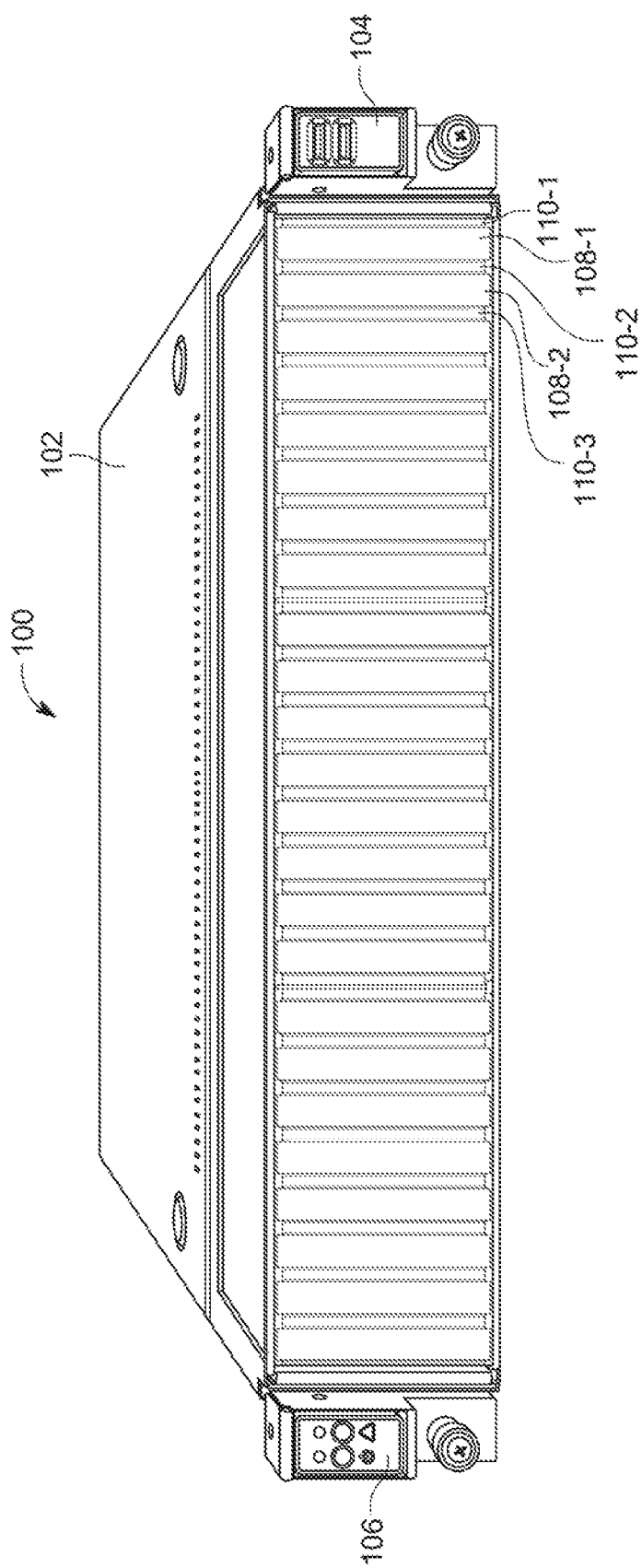
FIG. 1 illustrates a perspective view of a server with storage drives in standard form factors.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Most common server architectures are equipped with 3.5-inch HDDs, 2.5-inch HDDs, or a combination of both 3.5-inch HDDs and 2.5-inch HDDs. Recently, new hard drives have been released that have a different form factor compared to the common 3.5-inch HDD and 2.5-inch HDD form factors. An example hard drive with a form factor that departs from the common 3.5-inch HDD and 2.5-inch HDD form factors is a "Ruler" solid state disk (SSD). A Ruler SSD has a smaller width compared to a 2.5-inch HDD. Although the Ruler SSD has a smaller width, the storage capacity of a Ruler SSD may be larger than that of a 2.5-inch HDD. As such, the Ruler SSD with a smaller form factor can greatly increase total storage capacity of the server. Some embodiments of the present disclosure provide a cage for holding storage disks of a computing device (e.g., a server). Some embodiments of the present disclosure provide a method of assembling a cage to hold storage disks of a computing device. Some embodiments of the present disclosure provide a partition design for a cage that holds storage disks. Partitions designed according to some embodiments can improve structural strength and promote stability of the apparatus that holds storage disks. In some embodiments of the present disclosure, a cage for holding storage disks reduces risk of electromagnetic interference (EMI) and electrostatic discharge (ESD) failures to the storage disks. EMI and ESD reduction can be accomplished by bilateral partitions of the cage restricting movement of each of the storage disks. The partitions can include EMI springs fixed in grooves of the partitions for reducing EMI and ESD.

FIG. 1 illustrates a perspective view of a prior art server 100 with storage drives 108-1, 108-2, 108-3, etc., in a standard form factor. A standard form factor is a 2.5-in HDD form factor or a 3.5-in HDD form factor. The server 100 includes a server housing 102, a control panel 106 with one or more buttons, one or more ports 104. The hard drives 108-1, 108-2, 108-3, etc., are separated by partitions 110-1, 110-2, 110-3, etc.

Figure 2:
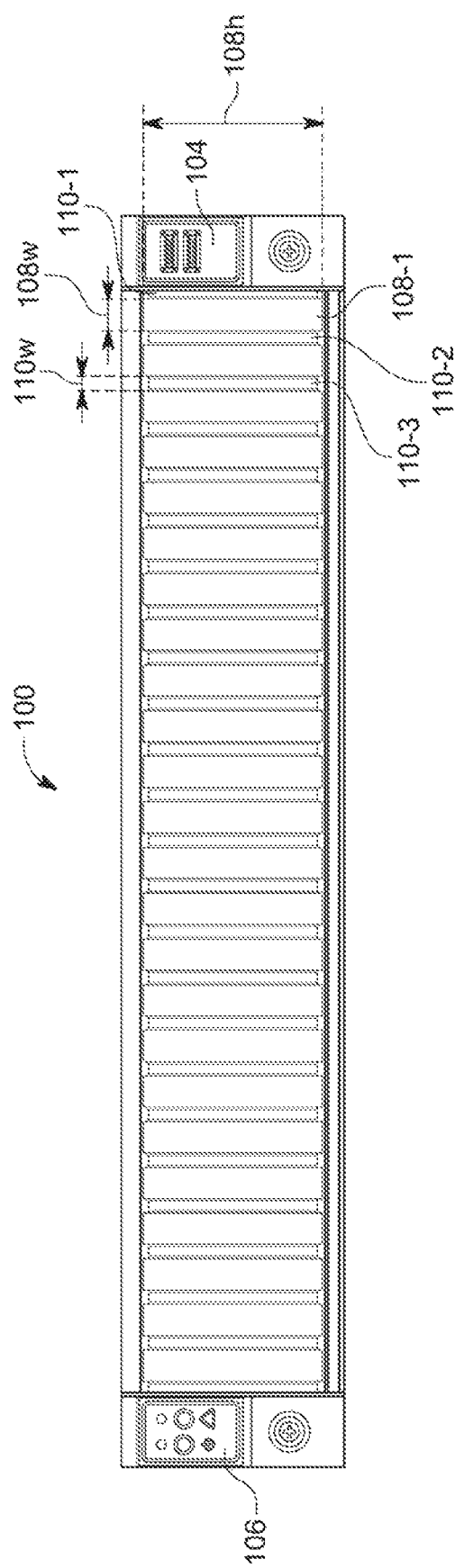
FIG. 2 illustrates a front view of the server of FIG. 1.

Referring to FIG. 2, a front view of the server 100 of FIG. 1 is provided. Each storage drive and each partition of the server 100 has a defined height and width. For example, the storage drive 108-1 has a height 108$h$ and a width 108$w$. The height 108$h$ is also the height of the partition 110-1. The partition 110-1 has a width 110$w$ that is smaller than the width 108$w$ of the storage drive 108-1. The height 108$h$ can be about 2.6 inches to about 4.1 inches. The width 108$w$ can be about 1 inch. The width 110$w$ can be about 0.2 to 2 mm.

Figure 3:
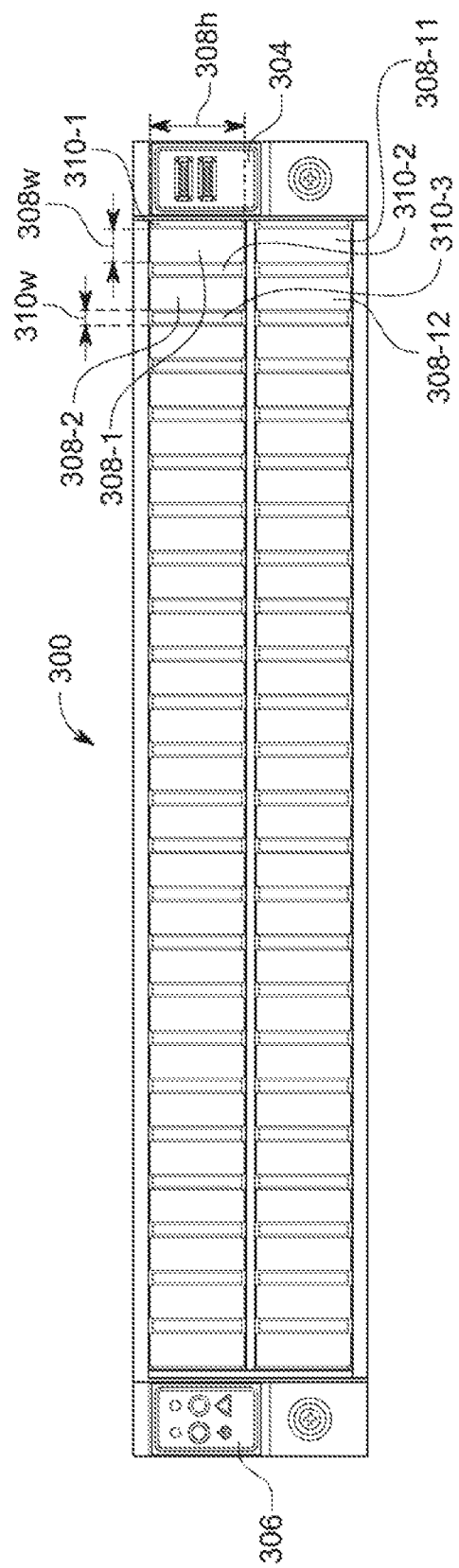
FIG. 3 illustrates a front view of a server with storage drives in a smaller form factor compared to the standard form factor of FIGS. 1 and 2, according to some implementations of the present disclosure.

Referring to FIG. 3, a front view of a server 300, with storage drives (e.g., storage drives 308-1, 308-2, 308-3, etc.) having a smaller form factor compared to the storage drives 108-1, 108-2, 108-3, etc., in FIG. 1 is provided. The server 300 includes a control panel 306 with one or more buttons and one or more ports 304. The one or more ports 304 can be universal serial bus (USB) ports, serial ports, parallel ports, etc. The storage drive 308-1 has a height 308$h$ and a width 308$w$. The height 308$h$ of the storage drive 308-1 is less than the height 108$h$ of the storage drive 108-1 in FIG. 1. In some implementations, the height 308$h$ is about half the height 108$h$. Since the height 308$h$ can be less than about half the height 108$w$ in FIG. 1, the server 300 in FIG. 3 includes two rows of storage drives (e.g., storage drives 308-1 and 308-2 are on a first row, and storage drives 308-11 and 308-12 are on a second row). The server 300 and the server 100 are about the same size, hence more storage drives 308-X can be included in the server 300 compared to the server 100. The width 308$w$ of the storage drive 308-1 is less than or equal to the width 108$w$ of the storage drive 108-1. The width 308$w$ can be about 9.5 mm or can be about 15 mm, and the height 308$h$ can be about 33.75 mm.

Figure 4:
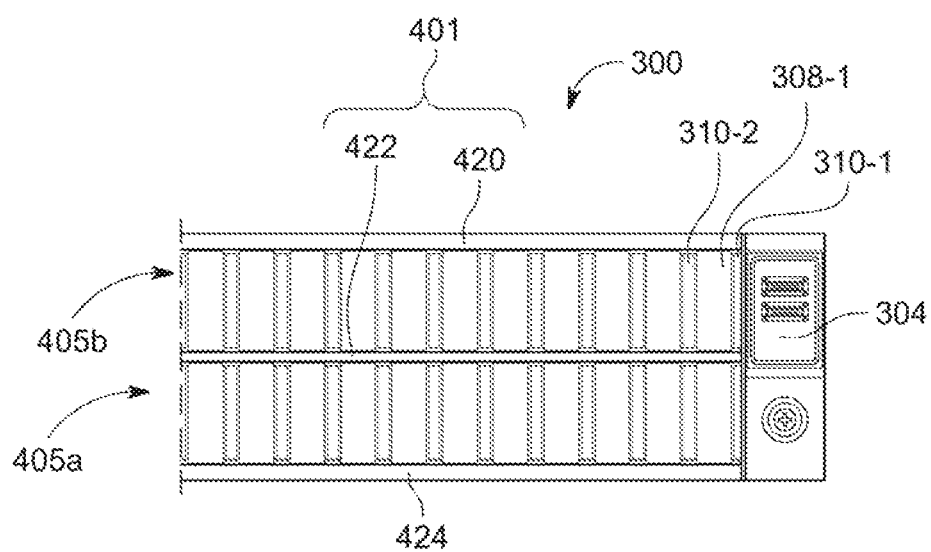
FIG. 4 illustrates a front view of a portion of the server of FIG. 3.

The server 300 includes partitions 310-1, 310-2, 310-3, etc. Each partition (e.g., the partition 310-1) is as tall as the height 308$h$. Each partition (e.g., the partition 310-1) has a width 310$w$. The width 310$w$ of each partition 310-X is less than the width 110$w$ of each partition 110-X. The width 310$w$ for the partitions 310-1, 310-2, 310-3, . . . can be about 3 mm to about 8 mm. Due to the smaller value of the height 308$h$ compared to the height 108$h$, two or more storage drives 308-X can be stacked on top of each other. FIG. 4 illustrates a portion of the server 300 of FIG. 3 having a first row 405$a$ of storage drives and a second row 405$b$ of storage drives stacked on the first row 405$a$. The server 300 is shown to include three cage panels (e.g., a top cage panel 420, a middle cage panel 422, and a bottom cage panel 424) that partially define a storage drive cage 401 with the first row 405$a$ and the second row 405$b$ of the storage drives 308-X.

Figure 5A:
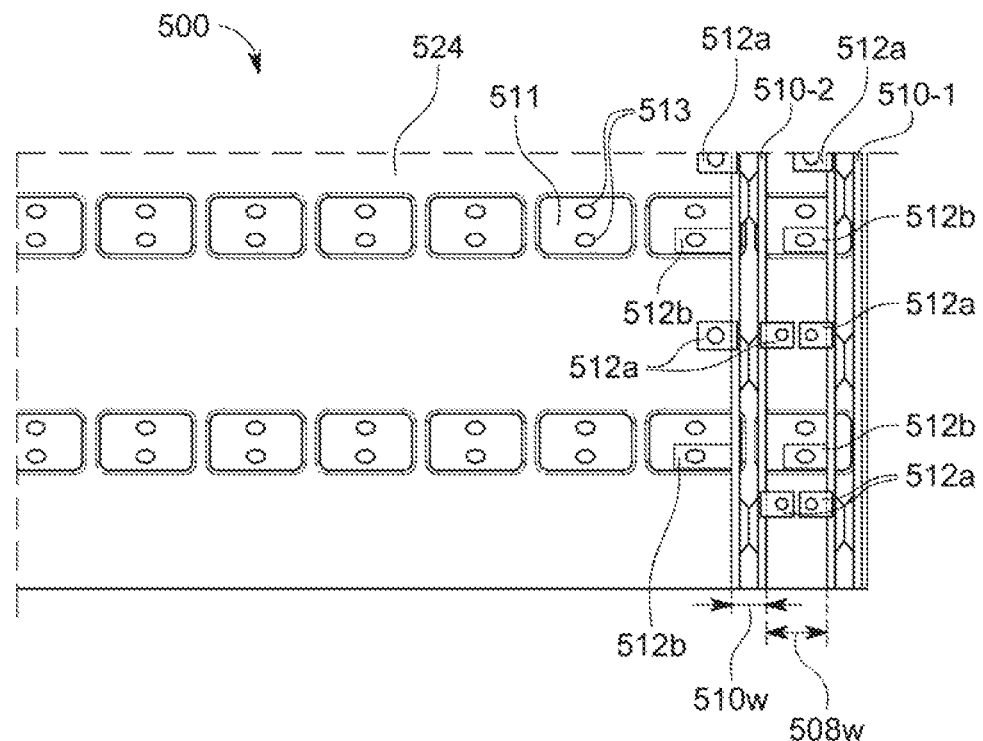
FIG. 5A illustrates a known cage panel and partition design.

FIG. 5A illustrates a known cage panel and partition design 500. The cage panel and partition design 500 includes a cage panel 524 and at least one partition, such as a partition 510-1 or a partition 510-2. The cage panel 524 includes recessed regions 511 with panel holes 513. In some implementations, the panel holes 513 are rivet holes provided to secure a partition (e.g., the partition 510-1) to the cage panel 524. Each partition (e.g., the partitions 510-1 and 510-2) includes one or more protrusions or tabs that can be secured to the respective panel holes 513. For example, the partition 510-1 and the partition 510-2 include top tabs 512$a$ and bottom tabs 512$b$. The bottom tabs 512$b$ can be aligned in recessed regions 511 substantially matching at least one of the panel holes 513. The bottom tabs 512$b$ can be secured to the cage panel 524. The top tabs 512$a$ can be secured to a cage panel (not shown) above the cage panel 524. In this manner, two cage panels can be arranged parallel each other and separated by partitions (see e.g., the bottom cage panel 424 and the middle cage panel 422 of FIG. 4).

The recessed regions 511 of the cage panel 524 are periodically spaced such that the partitions 510-1 and 510-2 with a width 510$w$ can be separated by a spacing 508$w$. The spacing 508$w$ is a space provided to receive storage drives (e.g., the width 108$w$ of FIG. 2 is analogous to the spacing 508$w$). When assembling the cage panel and partition design 500 of FIG. 5A, the spacing 508$w$ between adjacent partitions can be a limiting factor. For conventional storage drives, the spacing 508$w$ may be large enough to accommodate rivet guns that secure partitions to cage panels. But when storage drives of smaller form factors are considered, the spacing 508$w$ may not be wide enough to accommodate the rivet guns (see e.g., FIG. 5C).

Figure 5B:
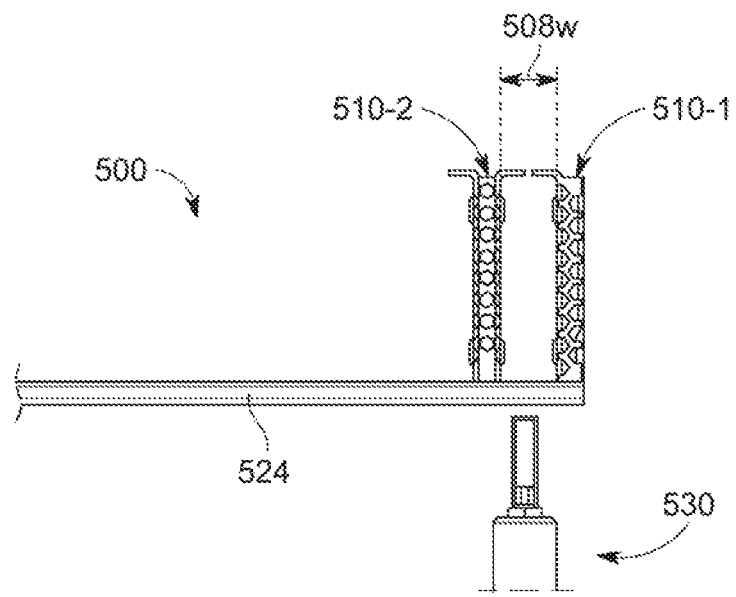
FIG. 5B illustrates a first assembly position for assembling a cage panel and partition design, according to FIG. 5A.
Figure 5C:
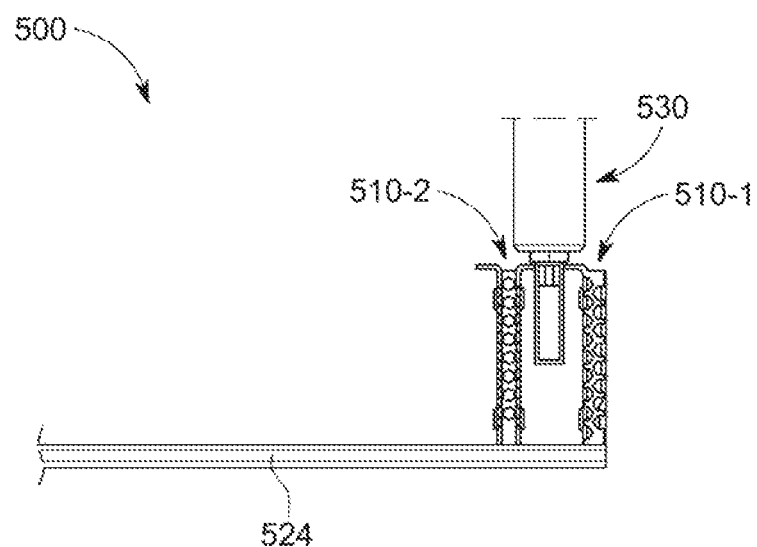
FIG. 5C illustrates a second assembly position for assembling a cage panel and partition design, according to FIG. 5A.

FIG. 5B illustrates a first assembly position for assembling the cage panel and partition design 500 of FIG. 5A. FIG. 5C illustrates a second assembly position for assembling the cage panel and partition design 500 of FIG. 5A. In FIG. 5B, a rivet gun 530 is positioned underneath the cage panel 524, and rivets are then used to secure the partitions, such as the partitions 510-1, to the cage panel 524. In FIG. 5C, the rivet gun 530 is unable to access the cage panel 524 for securing the partitions 510-1 and 510-2 to the cage panel 524 because of the narrower spacing between the partitions 510-1 and 510-2 for accommodating smaller form factors. When a server includes only one row of storage drives (e.g., the server 100 of FIG. 2), the first assembly position of FIG. 5B is acceptable for assembling a storage drive cage that will hold the one row of storage drives. On the other hand, when a server includes two rows of storage drives (e.g., the server 300 of FIG. 4), the second assembly position shown in FIG. 5C becomes a limiting factor for rapid assembly.

Figure 5D:
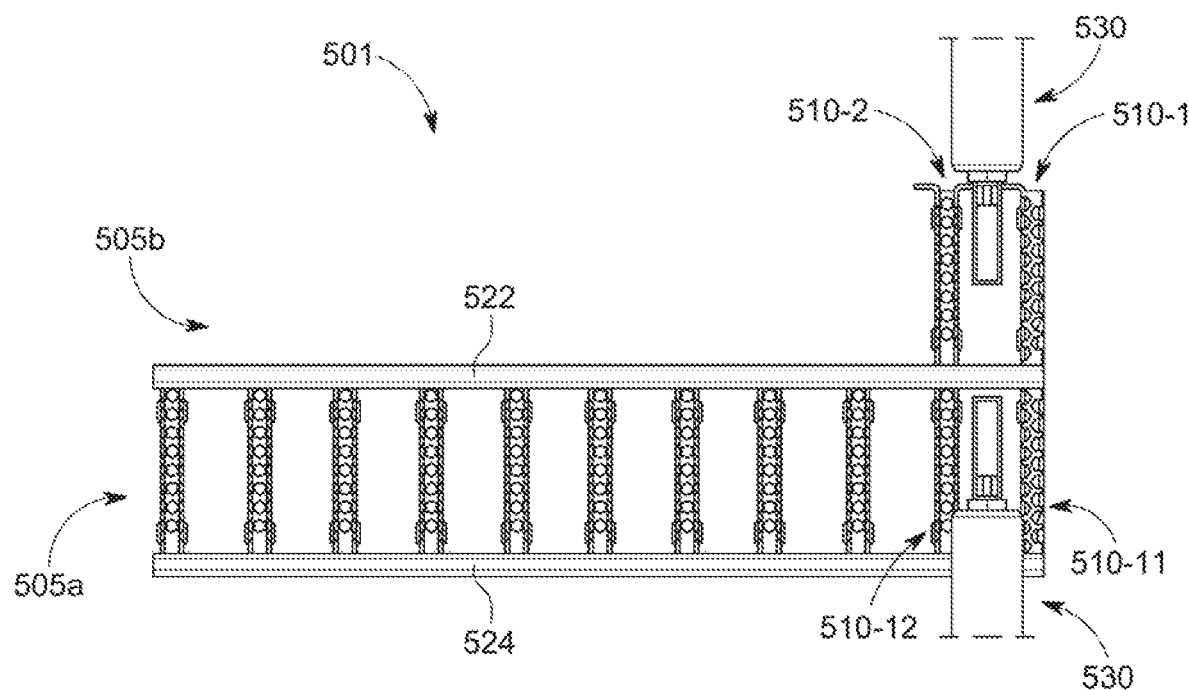
FIG. 5D illustrates spacing preventing use of a rivet gun in assembling a cage panel and partition design, according to FIG. 5A.

FIG. 5D illustrates a configuration 501 that may arise when two or more rows (e.g., a top row 505b and a bottom row 505a) of storage drives are accommodated by a storage cage. By using the first assembly position of FIG. 5B, the partitions in the bottom row 505a (e.g., partitions 510-11 and 510-12) can be secured to a bottom cage panel 524 and a middle cage panel 522. When the partitions 510-1 and 510-2 are secured to the middle cage panel 522, the second assembly position shown in FIG. 5C presents itself. The rivet gun 530 is unable to reach the middle cage panel 522 from a direction underneath the middle cage panel 522, or from a direction above the middle cage panel 522. As such, storage drive cages with multiple rows may not be possible using conventional cage panels, partitions, and assembly methods. Embodiments of the present disclosure provide a cage panel, partition designs, and assembly methods for enabling the construction of storage drive cages with multiple rows, thereby overcoming the situation illustrated in FIG. 5D.

Figure 6A:
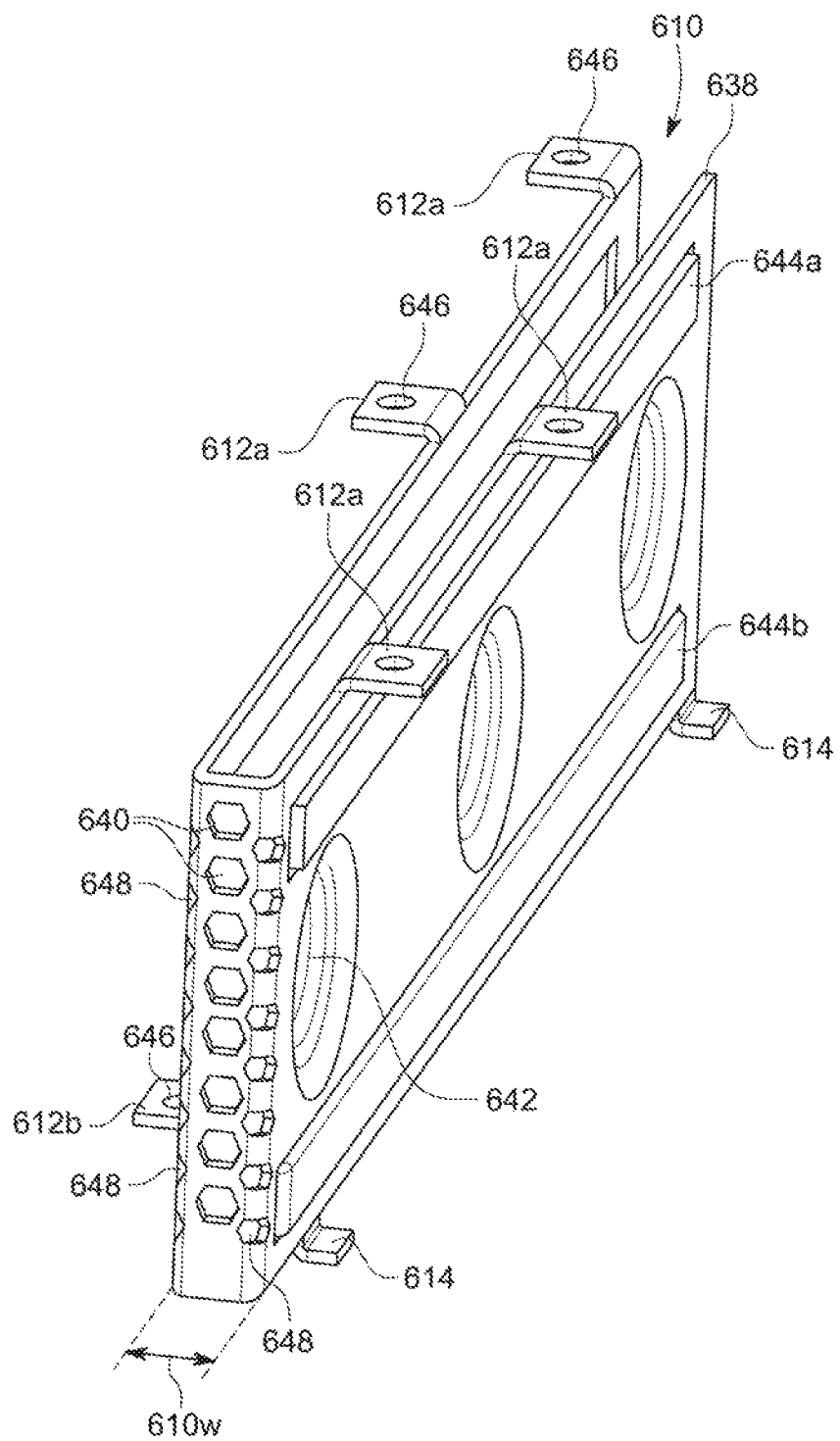
FIG. 6A illustrates a perspective view of a partition according to some implementations of the present disclosure.

Referring to FIG. 6A, a perspective view of a partition 610 is provided, according to some implementations of the present disclosure. The partition 610 can have a width 610w that can be similar to or the same as the width 310w of FIG. 3. The partition 610 includes a partition body. In some implementations, the partition body is a U-shaped metal sheet 638. The U-shaped metal sheet 638 includes one or more top tabs 612a. Each of the top tabs 612a has an aperture or a hole 646 for securing the partition 610 to a cage panel (not shown). The partition 610 is shown with four top tabs 612a, but it is understood that mom or less than four top tabs 612a can be provided on the partition 610. Furthermore, the partition 610 is shown to include a pair of two top tabs 612a on each side of the U-shaped metal sheet 638. In some implementations, a number of top tabs 612a on a left side of the U-shaped metal sheet 638 can be different than a number of top tabs 612a on a right side of the U-shaped metal sheet 638.

In some implementations, the U-shaped metal sheet 638 further includes one or more bottom tabs 612b, with each of the one or more bottom tabs 612b having a hole 646 for securing the partition 610 to a cage panel (not shown). The U-shaped metal sheet 638 can further include one or more bottom protrusions 614 for securing the partition 610 to the cage panel. In some implementations, the one or more bottom protrusions 614 do not include holes, differentiating them from the one or more bottom tabs 612b. In some implementations, the one or more bottom tabs 612b are provided on a first side of the partition 610 (e.g., on a left side of the U-shape), and the one or more bottom protrusions 614 are provided on second side of the partition 610 (e.g., on a right side of the U-shape). In some implementations, some of the one or more bottom protrusions 614 are provided on the first side of the partition 610 as well.

In some implementations, the U-shaped metal sheet 638 includes one or more openings or vents 640 and 648. Shapes of the vents 640 and 648 can include a circular shape, a hexagonal shape, a pentagonal shape, a polygonal shape, or any combination thereof. The vents 640 and 648 promote airflow through the partition 610.

In some implementations, the U-shaped metal sheet 638 includes one or more bumpers (e.g., a top bumper 644a and a bottom bumper 644b) on the first side and the second side of the partition 610. The bumpers 644a, 644b can be padding or can be metal. The bumpers 644a, 644b facilitate sliding a storage drive (not shown) against the partition 610 during installation or removal of the storage drive. In some implementations, the storage drive rests between the top bumper 644a and the bottom bumper 644b in FIG. 6A, with the bottom bumper 644b partially holding the weight of the storage drive. In some implementations, neither the top bumper 644a nor the bottom bumper 644b partially holds the weight of the storage drive, and the storage drive merely contacts or touches the bumpers 644a, 644b.

Figure 6B:
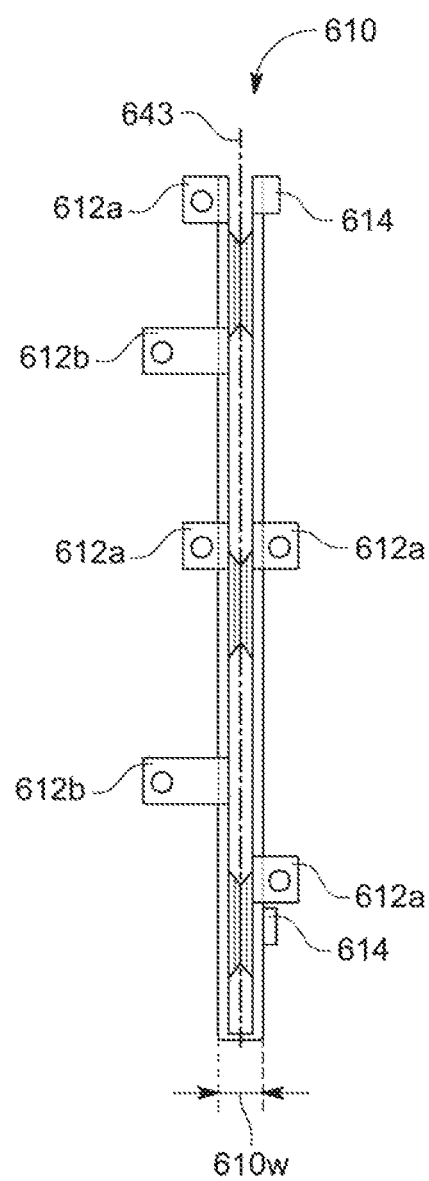
FIG. 6B illustrates a top view of the partition of FIG. 6A.

In some implementations, the U-shaped metal sheet 638 can include one or more side contours 642. The one or more side contours 642 can be provided on the first side of the partition 610, on the second side of the partition 610, or on both the first side and the second side of the partition 610. Referring to FIG. 6B, a top view of the partition 610 of FIG. 6A is provided. As shown in FIG. 6B, the partition 610 has the one or more side contours 642 (in FIG. 6A) on both the first side of the partition 610 and the second side of the partition 610. The one or more side contours 642 are shown to meet at a center plane 643, providing additional contact points between the first side of the partition 610 and the second side of the partition 610. In some implementations, the one or more side contours 642 are hollow to support airflow, such that air can flow from a side contour on the first side of the partition 610 to a side contour on the second side of the partition 610, and vice versa.

Figure 7A:
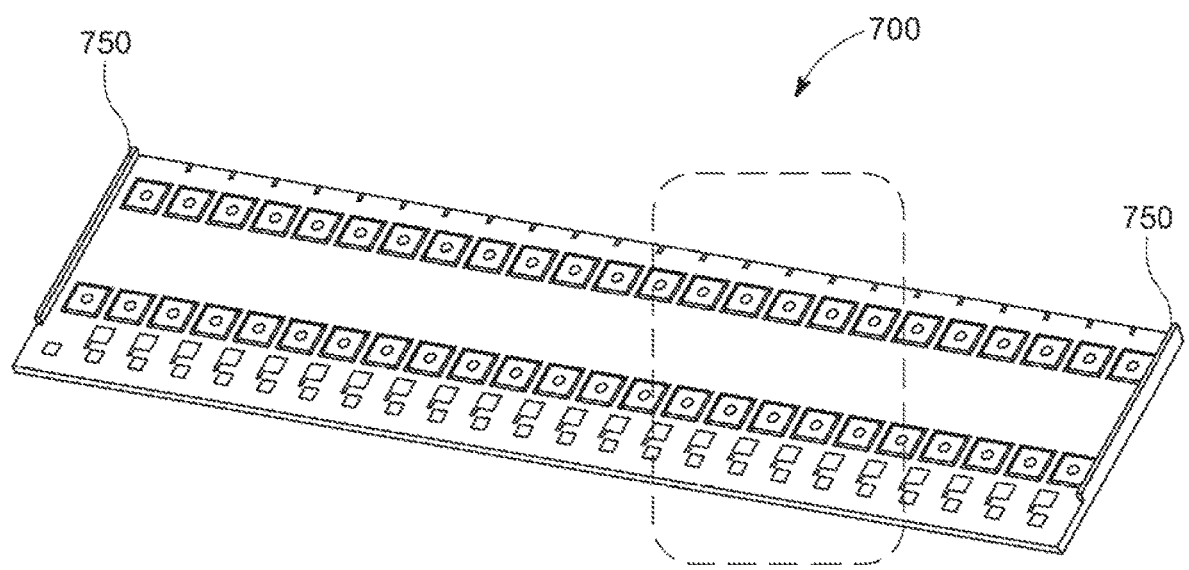
FIG. 7A illustrates a cage panel according to some implementations of the present disclosure.
Figure 7B:
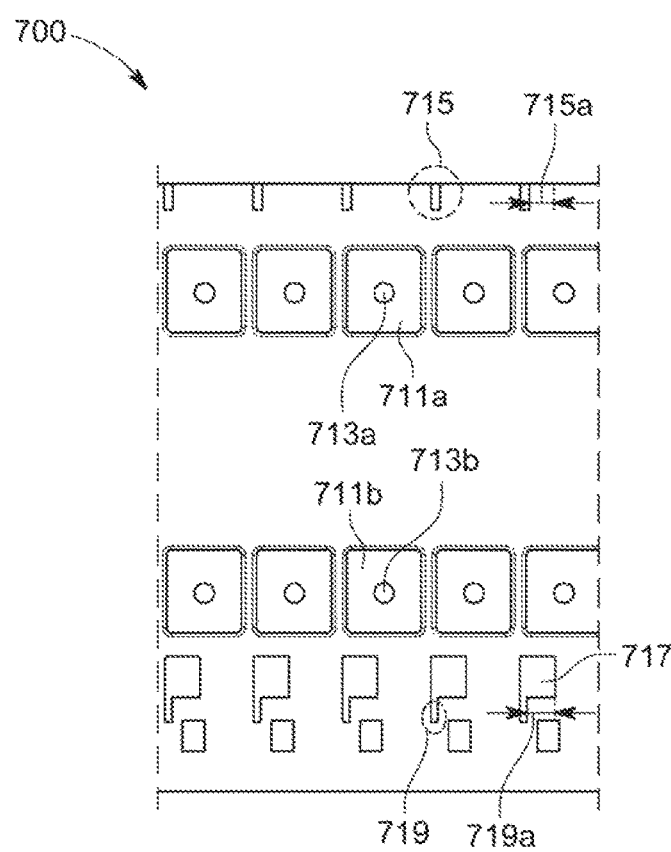
FIG. 7B illustrates a portion of the cage panel of FIG. 7A.

Referring to FIG. 7A, a cage panel 700 is provided according to some implementations of the present disclosure. The cage panel 700 is generally planar with a rectangular aspect ratio. In some implementations, the cage panel 700 can include two end features 750. The cage panel 700 can be a bottom cage panel, a middle cage panel, or a top cage panel such as the respective panels 424, 422, or 420, as defined in connection with the server 300 of FIG. 4. FIG. 7B illustrates a zoomed in portion of the cage panel 700. The cage panel 700 can be formed of a sheet of material or substrate, for example, a sheet of metal. The cage panel 700 can include a number of first recessed regions (e.g., a first row of first recessed regions 711a and a second row of first recessed regions 711b) on one planar surface. The first recessed regions 711a and 711b can include apertures or holes 713a and 713b, respectively, for securing partitions (e.g., for securing the partition 610 of FIG. 6A). Although one hole 713a, 713b is shown in FIGS. 7A and 7B for each of the first recessed regions 711a, 711b, more than one hole can be provided in each of the first recessed regions 711a, 711b. In this example, sufficient recessed regions 711a, 711b are provided for up to 24 partitions. In some implementations, partitions are not attached to all recessed regions 711a, 711b in order to change the width of the cages holding the storage devices.

The cage panel 700 further includes one or more stoppers (e.g., a top row of stoppers 715 and a bottom row of stoppers 719). In some implementations, the one or more stoppers 715, 719 are cuts in the cage panel 700 such that a region 715a, 719a is defined adjacent to the one or more stoppers 715, 719. The region 715a, 719a indicates an area underneath the planar surface of the cage panel 700 where a protrusion of a partition (e.g., the protrusion 614 of the partition 610) is located when the protrusion is stopped by the one or more stoppers 715, 719. When secured, the protrusion of the partition is tucked underneath the region 715a, 719a of the cage panel 700. In FIGS. 7A and 7B, the top row of stoppers 715 are provided at a top edge of the cage panel 700, and the bottom row of stoppers 719 are provided between the top edge of the cage panel 700 and a bottom edge of the cage panel 700. In some implementations, the number of rows of stoppers is the same as the number of protrusions 614 of the partition 610 (as shown in FIG. 6B).

The cage panel 700 can further include a series of second recessed regions 717. Each of the second recessed regions 717 provides space for maneuvering protrusions of a partition such that the protrusions can be tucked underneath the region 719a. In some implementations, the region 719a overhangs the second recessed region 717. In FIG. 7B, the second row of stoppers 719 are positioned next to the second recessed regions 717. The top row of stoppers 715 are next to an edge of the cage panel 700 and thus have enough neighboring space for maneuvering partitions. As such, no recessed region is positioned next to the top row of stoppers 715. Each of the bottom row of stoppers 719 and a respective one of the top row of stoppers 715 of FIG. 7B are configured to restrict motion of a partition in a single direction.

Figure 8A:
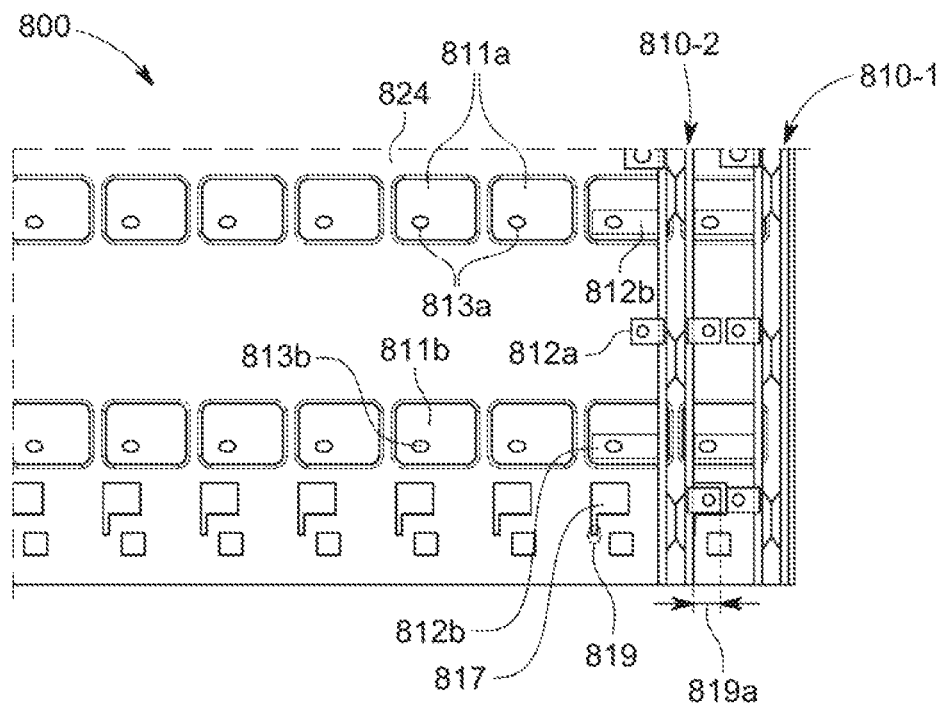
FIG. 8A illustrates partitions installed on a bottom cage panel, according to some implementations of the present disclosure.

Referring to FIG. 8A, a portion of a partial assembly 800 of two partitions 810-1 and 810-2 on a bottom cage panel 824 is provided, according to some implementations of the present disclosure. The bottom cage panel 824 is similar to or the same as the cage panel 700 of FIGS. 7A and 7B. The partitions 810-1 and 810-2 are similar to or the same as the partition 610 of FIGS. 6A and 6B, and include bottom tabs 812b and top tabs 812a. The bottom cage panel 824 includes a series of first recessed regions 811a and 811b, a series of holes 813a and 813b, a series of stoppers 819, and a series of second recessed regions 817. The bottom cage panel 824 also includes a region 819a where a protrusion of a partition (e.g., the partition 810-2) can be tucked underneath.

Figure 8B:
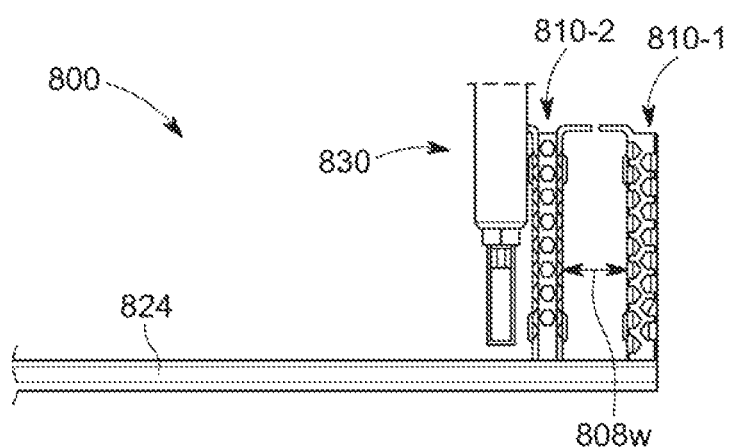
FIG. 8B illustrates a first assembly position for assembling a partition on the bottom cage panel of FIG. 8A, according to some implementations of the present disclosure.

When securing the partitions 810-1 and 810-2 to the bottom cage panel 824, the bottom tabs 812b of the partitions 810-1 and 810-2 are aligned with the holes 813b such that a rivet gun can be used to insert a rivet to secure the partitions 810-1 and 810-2 to the bottom cage panel 824. FIG. 8B illustrates an assembling position of the bottom panel 824, showing a rivet gun 830 for accessing the first recessed regions 811b to secure the partition 810-2 to the bottom cage panel 824. A separation or spacing 808w between the partitions 810-1 and 810-2 is about the same distance as the spacing 508w in FIG. 5B. Referring back to FIG. 8A, the bottom tabs 812b can have a different aspect ratio than the top tabs 812a. In some implementations, the bottom tabs 812b are longer than the top tabs 812a, so that holes provided on the bottom tabs 812b are positioned farther away from the partition 810-2. Positioning the holes of the bottom tabs 812b farther from the partition 810-2 provides additional space for accommodating a rivet gun (e.g., the rivet gun 830). In the implementation of FIGS. 8A and 8B, the partition 810-2 is secured on a first side via the holes 813a, 813b and secured on a second side via protrusions of the partition 810-2 being tucked under the region 819a.

Comparing FIGS. 5A and 5B to FIGS. 8A and 8B, the partition 510-2 in FIGS. 5A and 5B is so close to the partition 510-1 that it prevents accessing rivet holes between the partitions 510-2 and 510-1. In contrast, FIGS. 8A and 8B show installing the partitions 810-1 and 810-2 one at a time such that a rivet gun does not need to be positioned between the partitions 810-1 and 810-2. However, if a similar procedure is used for the partitions 510-1 and 510-2, where the partitions 510-1 and 510-2 are secured one at a time with a rivet gun, only one side of the partitions 510-1 and 510-2 will be secured. In contrast, the partition 810-2 has protrusions tucked underneath the bottom cage panel 824 so that both sides of the partition 810-2 are secured to the bottom cage panel 824. Increasing the number of connection points between a partition and a cage panel improves structural integrity of the assembled structure. Cages for holding storage disks usually undergo shock and vibration validation tests. As such, improved structural integrity of the disclosed assembly is desired for increasing the durability of constructed cages.

Figure 9:
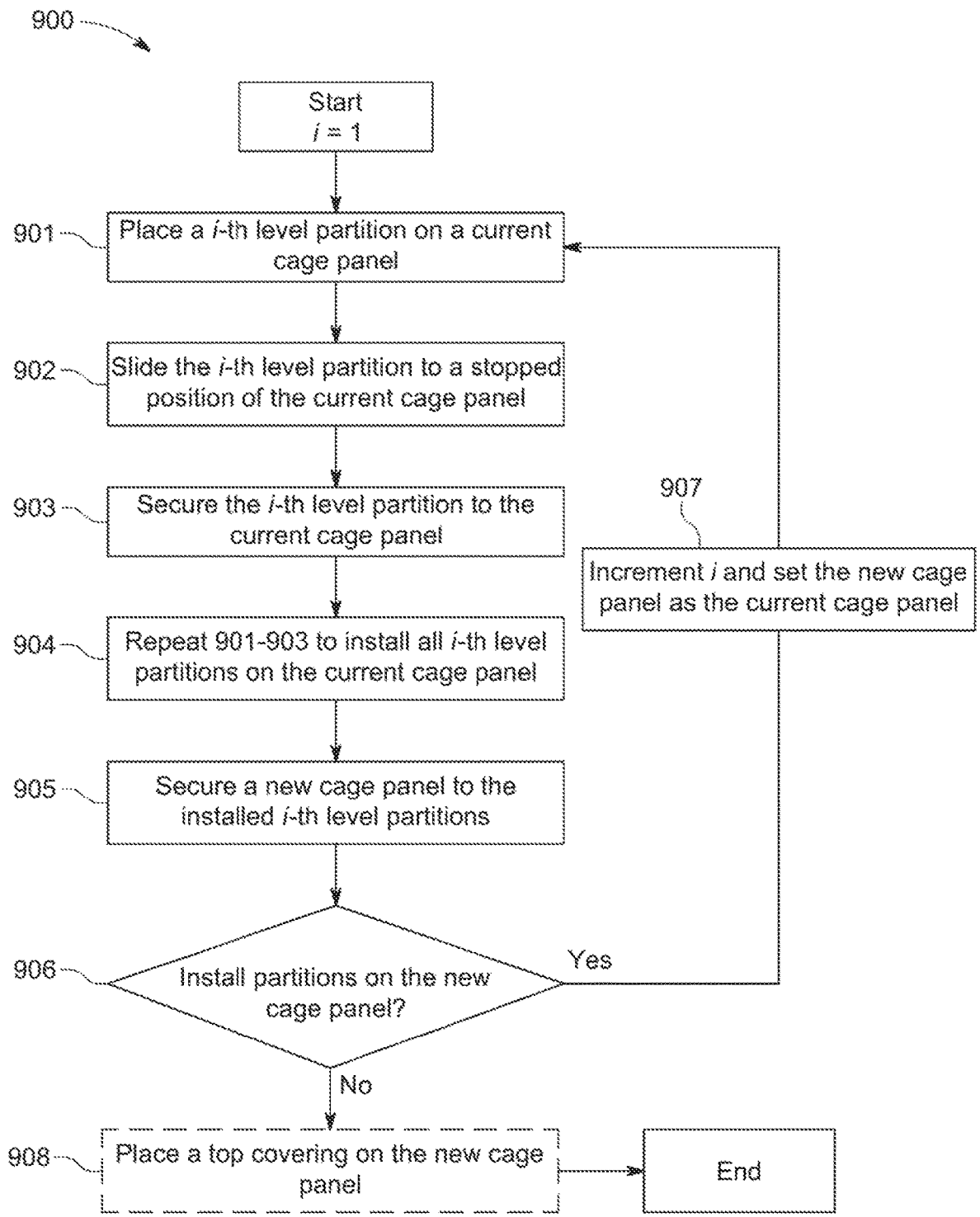
FIG. 9 is a flow diagram of a process for assembling partitions on cage panels, according to some implementations of the disclosure.

Referring to FIG. 9, a flow diagram of a process 900 for assembling partitions on cage panels is provided, according to some implementations of the present disclosure. The process 900 can be used to produce a cage for holding storage disks. The different steps in the process 900 is described in the following paragraphs with reference to FIGS. 10A-10M. In some implementations, the process 900 can be automated in a factory. The process 900 includes a start condition with a placeholder variable i=1. The variable i is merely used to denote the number of rows (e.g., the top row 505b and the bottom row 505a of FIG. 5D).

Figure 10A:
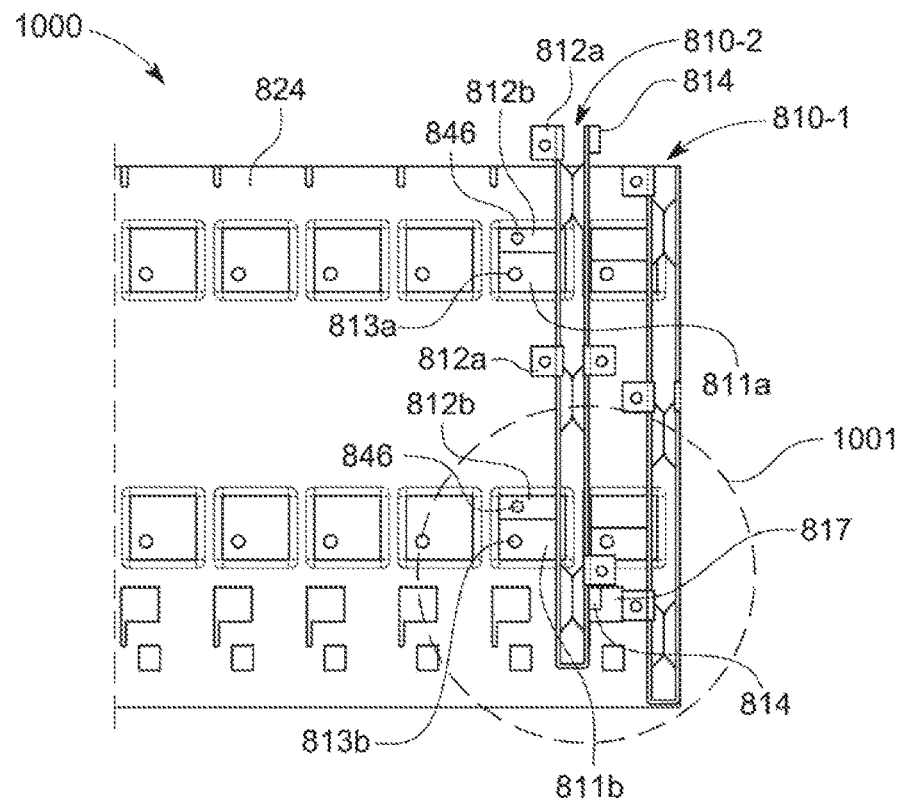
FIG. 10A illustrates a first state of a storage drive cage during assembly, according to some implementations of the present disclosure.
Figure 10B:
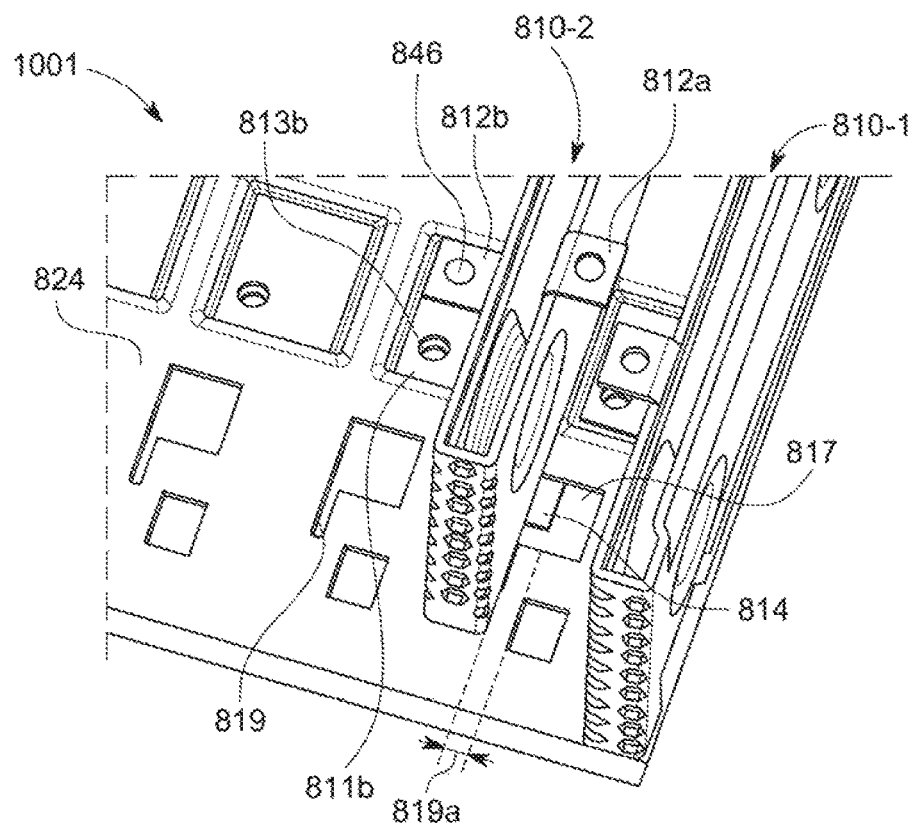
FIG. 10B illustrates a zoomed-in portion of the storage drive cage in FIG. 10A.

Step 901 involves placing an i-th level partition on a current cage panel. For example, a bottom cage panel can be the current cage panel and the i-th level partition can be a partition to be placed on a bottom row of a cage. Referring to FIG. 10A, a first snapshot shows the placing of the partition 810-2 on the bottom cage panel 824, according to some implementations. In FIG. 10A, the partition 810-2 and the bottom cage panel 824 of FIG. 8A are used herein as examples. The partition 810-2 is placed on the bottom cage panel 824 such that the bottom tabs 812b of the partition 810-2 are situated in two of the first recessed regions 811a and 811b. One of a series of bottom protrusions 814 of the partition 810-2 is positioned in one of the second recessed regions 817. As shown in FIG. 10A, the holes 846 of the bottom tabs 812b of the partition 810-2 are misaligned with the holes 813a, 813b of the bottom cage panel 824. FIG. 10B illustrates a perspective view of a zoomed-in portion 1001 of the first snapshot of FIG. 10A. In some implementations, the thickness of the bottom tabs 812b is less than or equal to the thickness of the vertical walls within the first recessed regions 811a, 811b.

Figure 10C:
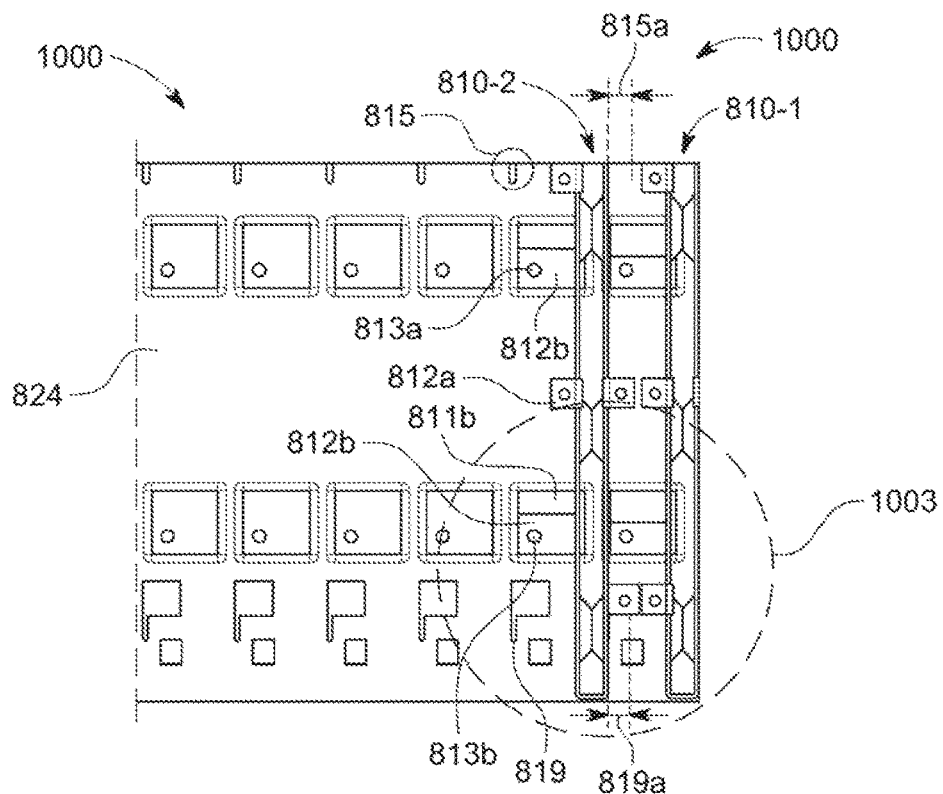
FIG. 10C illustrates a second state of a storage drive cage during assembly, according to some implementations of the present disclosure.
Figure 10D:
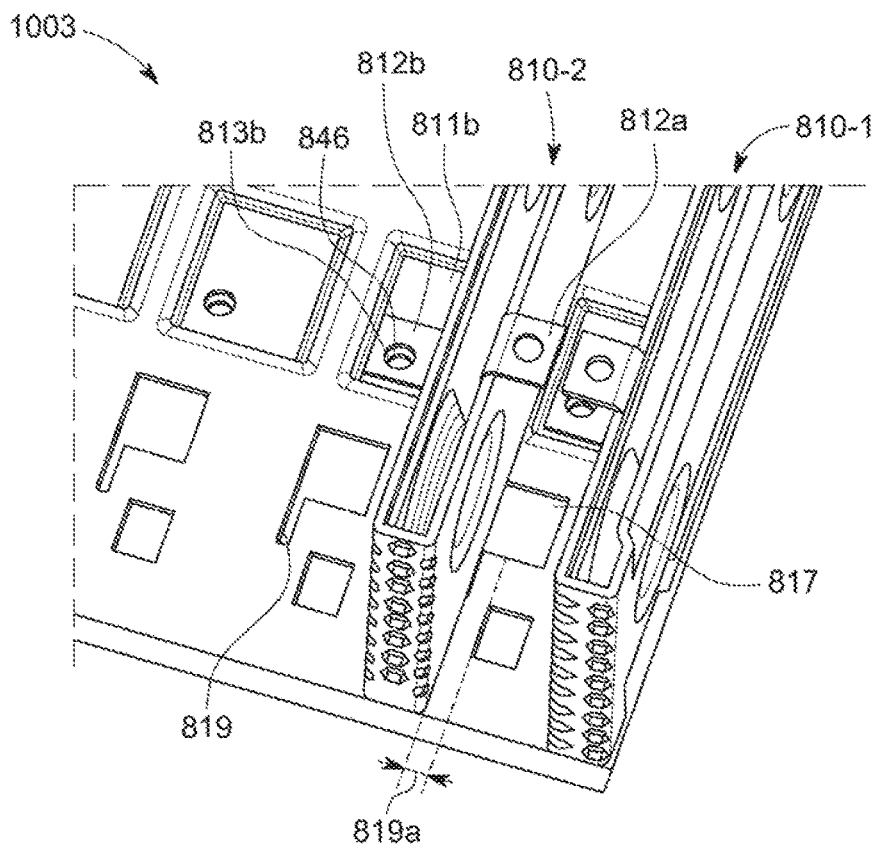
FIG. 10D illustrates a zoomed in portion of the storage drive cage in FIG. 10C.

Step 902 involves sliding the i-th level partition to a stopped position of the current cage panel. Referring to FIG. 10C, a second snapshot shows the partition 810-2 at a stopped position of the bottom cage panel 824, according to some implementations. In the stopped position, the holes 846 of the bottom tabs 812b of the partition 810-2 are aligned with the holes 813b of the bottom cage panel 824. In FIG. 10C, the bottom protrusions 814 (see FIG. 10A) of the partition 810-2 are tucked underneath a top surface of the bottom cage panel 824, and are positioned in the regions 815a, 819a. The stoppers 815, 819 prevent the bottom protrusions 814 from continuing to slide in a first direction, thus preventing the sliding motion of the partition 810-2 in the first direction at the stopped position. FIG. 10D illustrates a zoomed-in portion 1003 in FIG. 10C. Compared to FIG. 10B, the bottom protrusion 814 is no longer visible in the stopped position. In some implementations, the partition 810-2 is flush with at least one edge of the bottom cage panel 824.

Figure 10E:
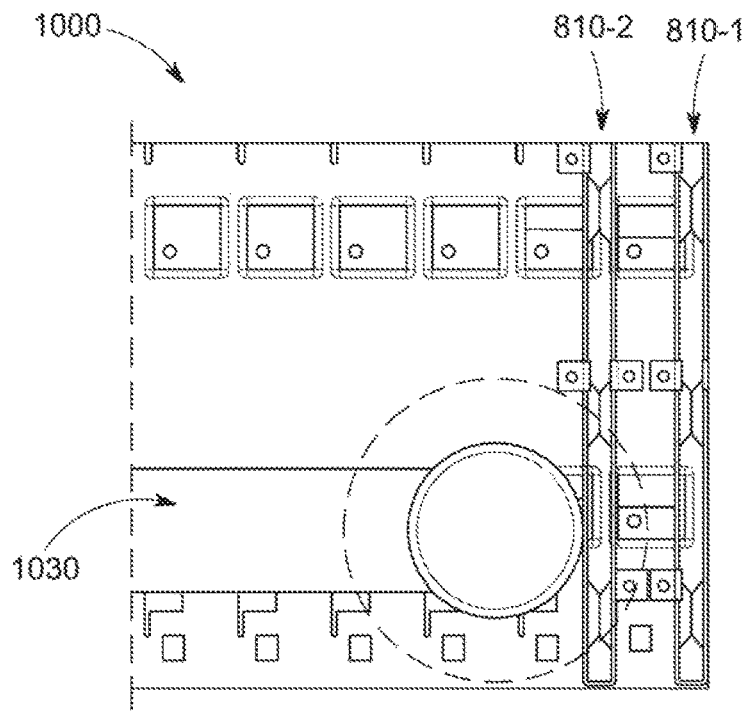
FIG. 10E illustrates a rivet gun positioned above a storage drive cage, according to some implementations of the present disclosure.
Figure 10F:
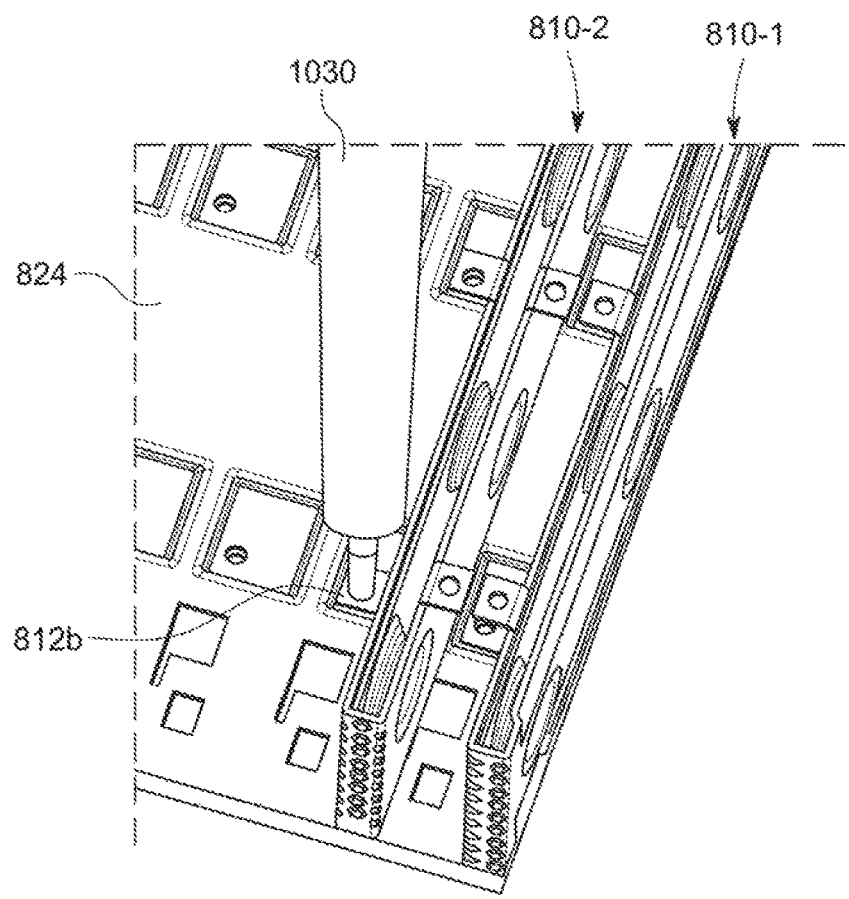
FIG. 10F illustrates a zoomed-in portion of the storage drive cage in FIG. 10E.

Step 903 involves securing the i-th level partition to the current cage panel. Referring to FIGS. 10E and 10F, a rivet gun 1030 can be used to secure the partition 810-2 to the bottom cage panel 824. The rivet gun 1030 is shown applying a rivet to the bottom tab 812b. All the bottom tabs 812b of the partition 810-2 are secured with rivets using the rivet gun 1030.

Figure 10G:
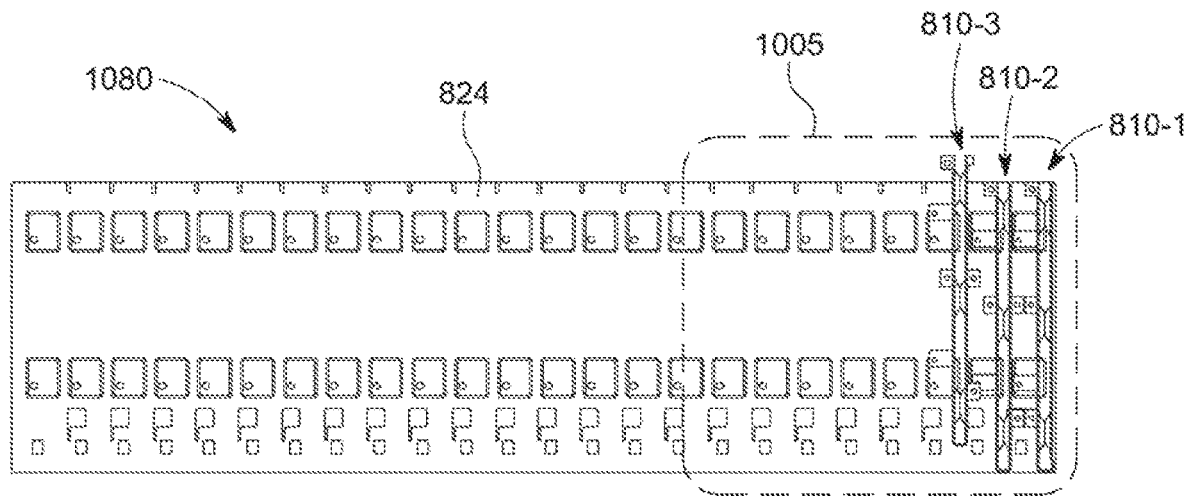
FIG. 10G illustrates a third state of a storage drive cage during assembly, according to some implementations of the present disclosure.
Figure 10H:
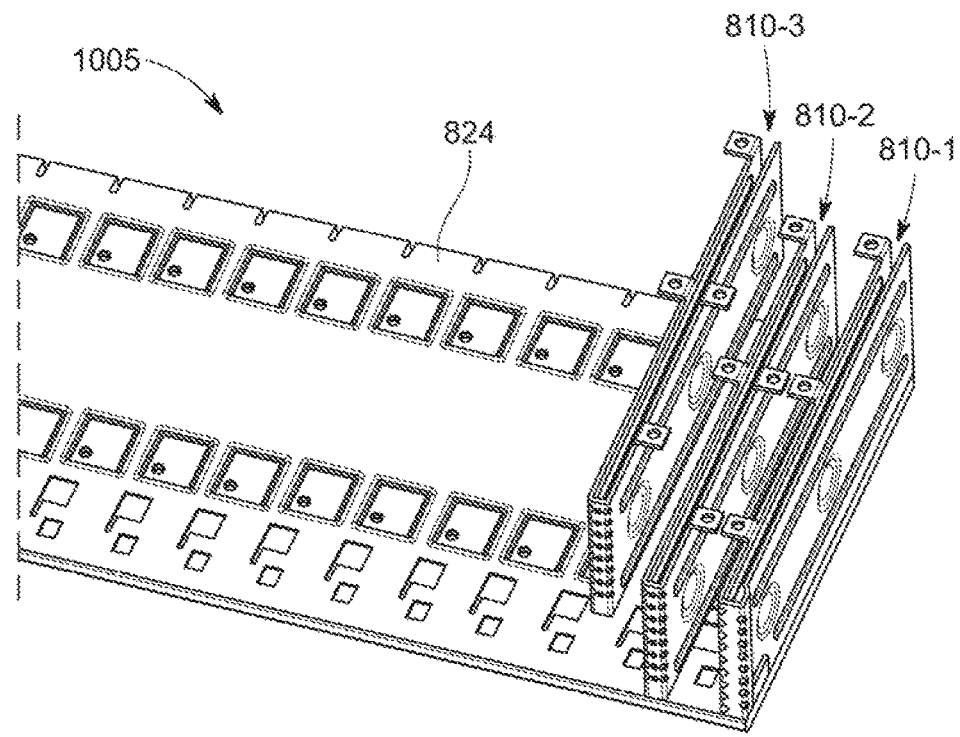
FIG. 10H illustrates a zoomed in portion of the storage drive cage in FIG. 10G.
Figure 10I:
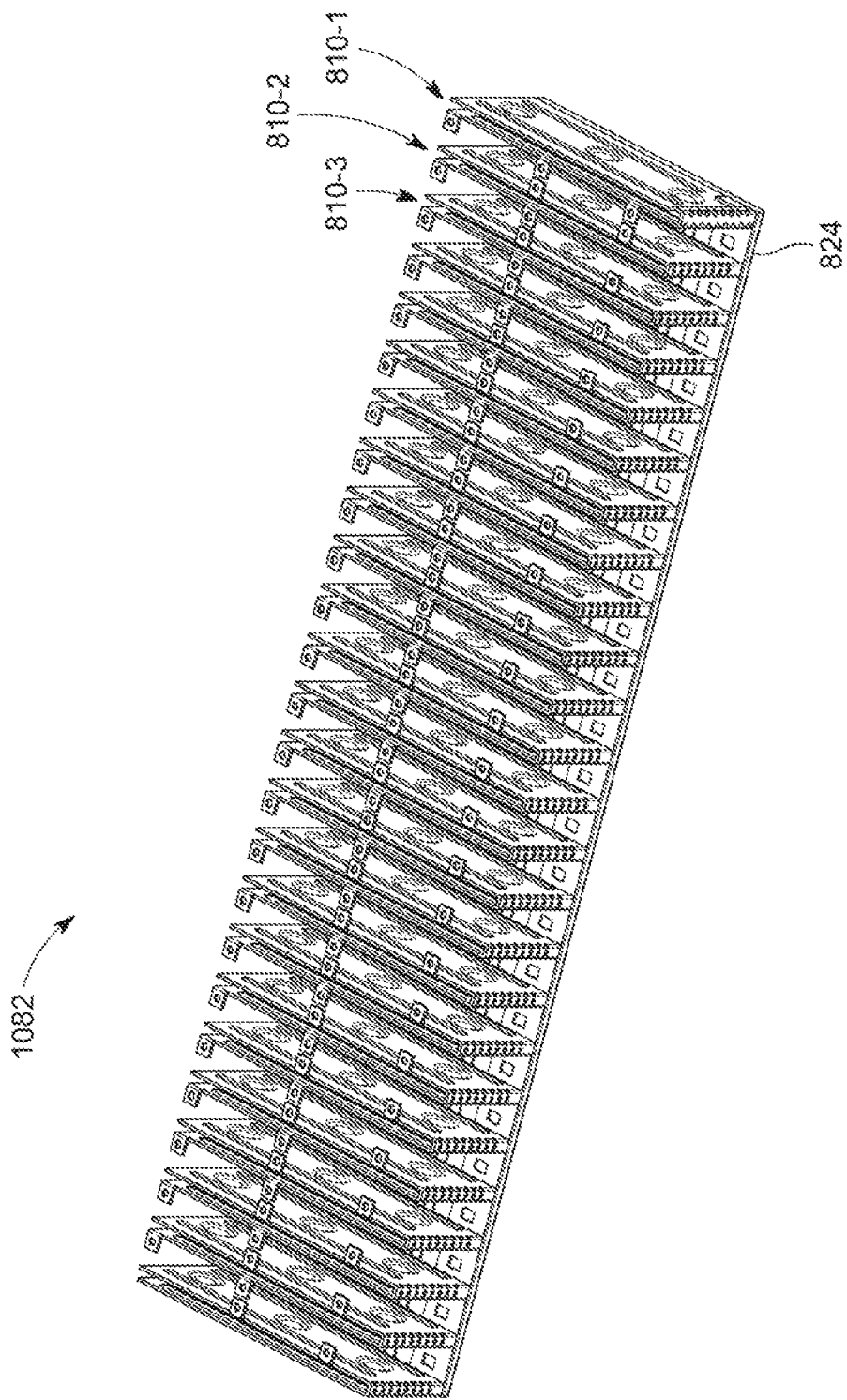
FIG. 10I illustrates a fourth state of a storage drive cage during assembly, according to some implementations of the present disclosure.

Step 904 involves repeating steps 901 to 903 to install all i-th level partitions on the current cage panel. For example, after the partition 810-2 is secured to the bottom cage panel 824, FIGS. 10G and 10H show a partition 810-3 in the process of being placed on the bottom cage panel 824 in a similar manner as described above in connection with step 901. FIGS. 10G and 10H illustrate a partition-panel combination 1080 with two installed partitions, 810-1 and 810-2, and one partition 810-3 being installed. A zoomed-in portion 1005 shows that once the partition 810-2 is installed, the partition 810-3 is next to be installed. FIG. 10I illustrates a partition-panel combination 1082 which is the end result once all partitions of the bottom cage panel 824 have been installed using the process described above.

Figure 10J:
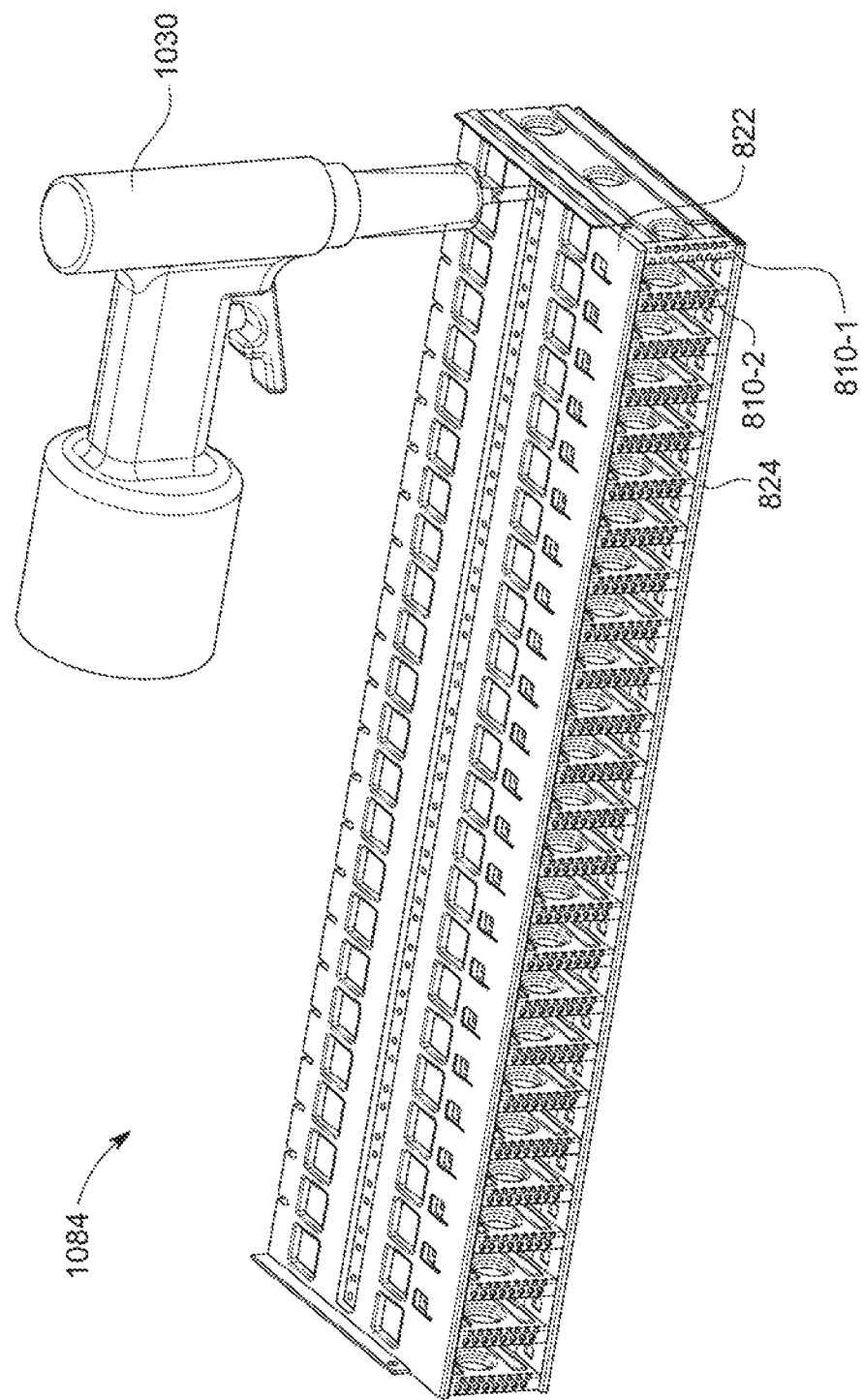
FIG. 10J illustrates a perspective view of a rivet gun positioned above a storage drive cage, according to some implementations of the present disclosure.

Step 905 involves securing a new cage panel to the installed i-th level partitions. Referring to FIG. 10J, a new cage panel (a middle cage panel 822) is placed on top of the partitions such as the partitions 810-1 to 810-3 of the bottom cage panel 824. FIG. 10J illustrates an assembling position 1084 where the rivet gun 1030 is used to insert rivets to secure the partitions to the middle cage panel 822. The middle cage panel 822 is secured to the partitions at locations corresponding to at least some of the top tabs 812a (see e.g., FIG. 10A).

Step 906 involves determining whether partitions should be installed on the new cage panel. If partitions are to be installed on the new cage panel, then step 907 is performed, but if not, optionally, step 908 can be performed.

Figure 10K:
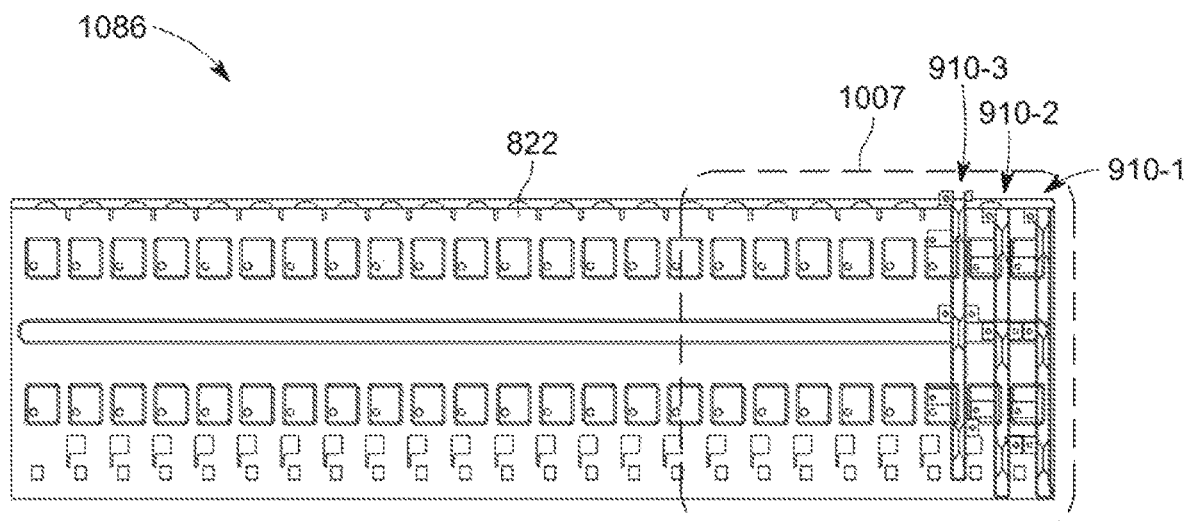
FIG. 10K illustrates a fifth state of a storage drive cage during assembly, according to some implementations of the present disclosure.
Figure 10L:
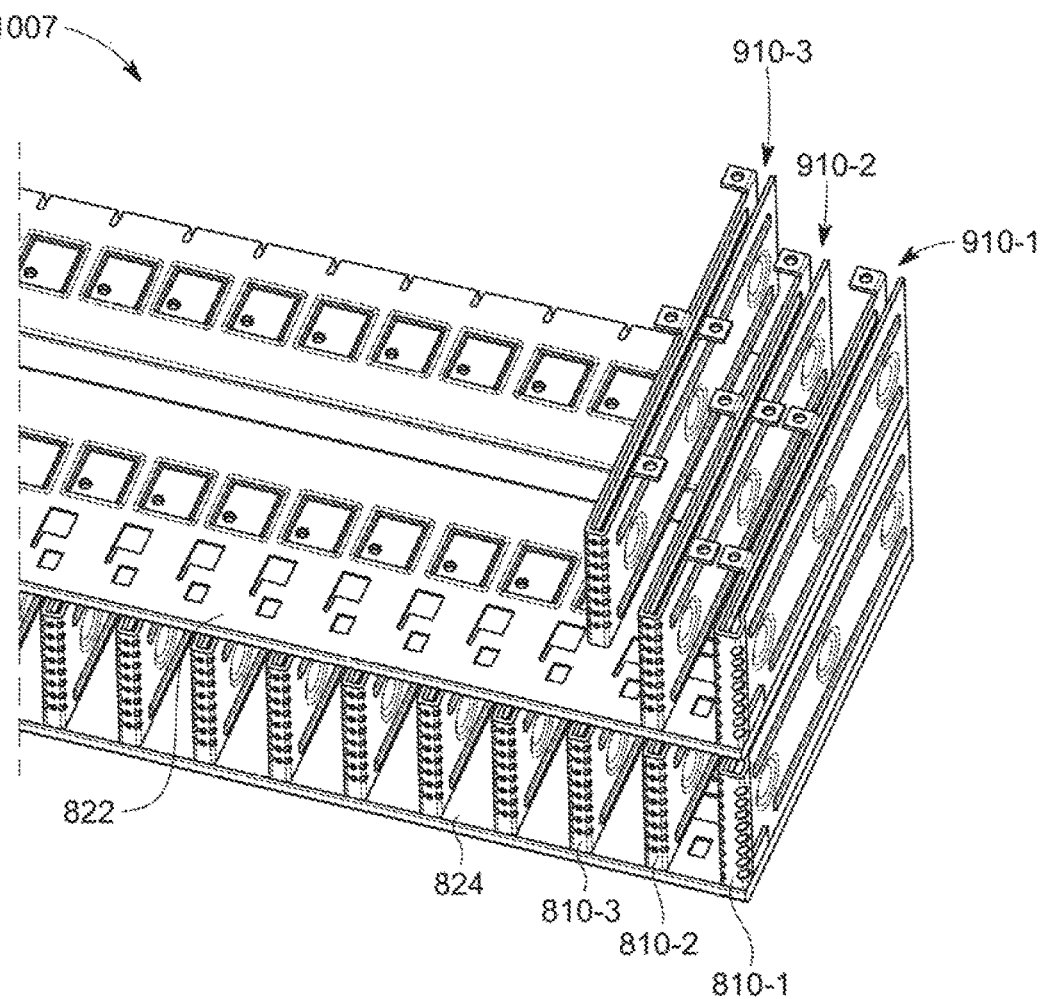
FIG. 10L illustrates a zoomed in view of the storage drive cage in FIG. 10K.

Step 907 involves incrementing i and setting the new cage panel as the current cage panel. Step 907 is merely a descriptive step such that the recursive description of steps 901 to 906 can be reused. Referring to the example of FIGS. 10A to 103, in FIG. 10J, the assembling position 1084 illustrates a completion of a one row cage. FIG. 10K illustrates an assembling position 1086 where partitions 910-1 and 910-2 have been installed according to steps 901 through 903, and the partition 910-3 is in the process of being installed on the middle cage panel 822. FIG. 10L illustrates a zoomed-in portion 1007 of FIG. 10K showing the partition 910-3 being installed after the installation of the partition 910-2.

Figure 10M:
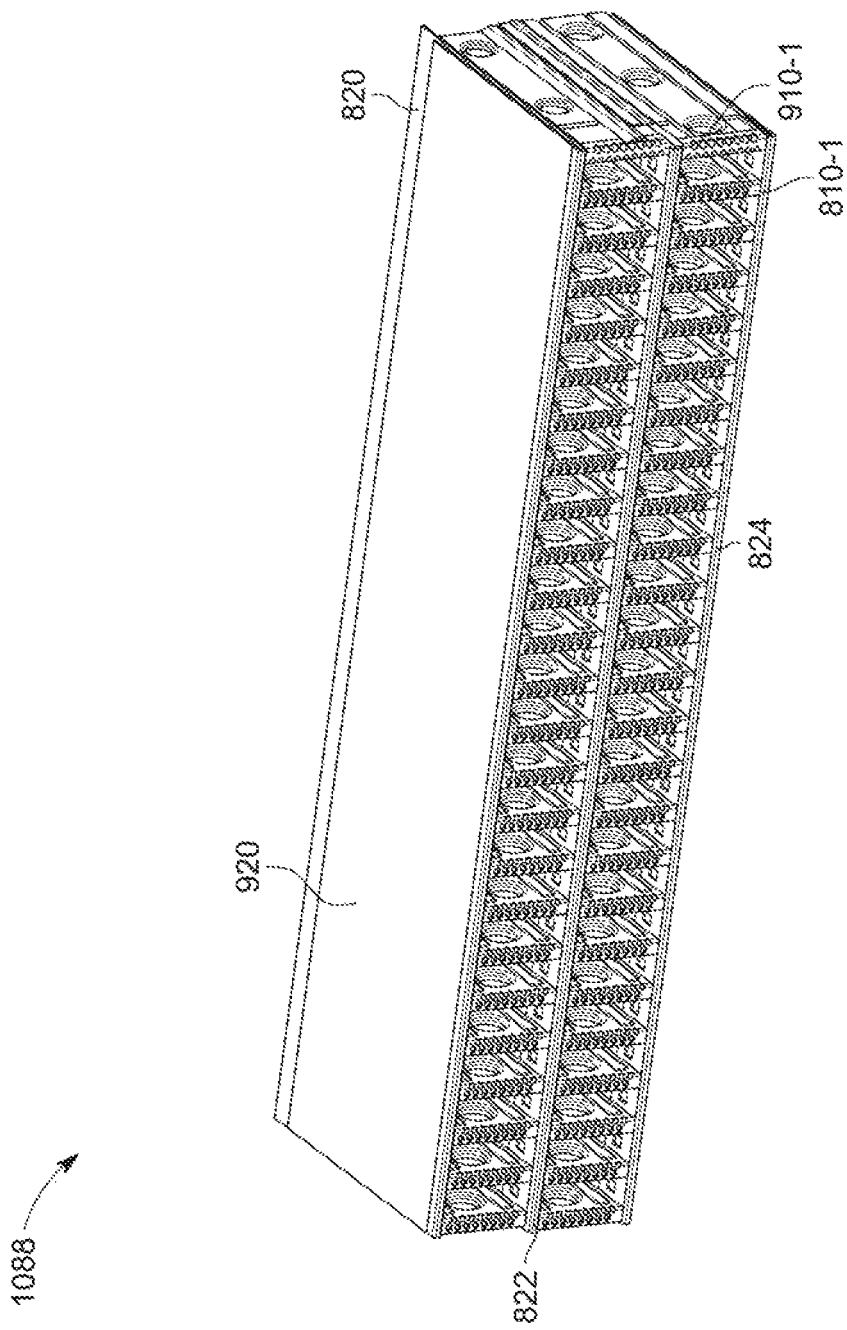
FIG. 10M illustrates a storage drive cage after assembly, according to some implementations of the present disclosure.

After installing all partitions, such as the partitions 910-1, 910-2, and 910-3 on the middle cage panel 822, a top cage panel 820 is secured to the partitions on the middle cage panel 822 in step 905 (see FIG. 10M). Securing the top cage panel 820 to the middle cage panel 822 completes a cage 1088 with two rows. If two rows are desired, then optionally, a top cover 920 can be placed on the top cage panel 820. The top cover 920 is merely decorative and can be omitted in some implementations.

The process 900 allows assembling a cage for holding computer components one layer or one row at a time. The process 900 allows securing each layer one partition at a time in a unidirectional manner. The direction for assembling the cage is determined based on the location of the bottom tabs of the partitions. Thus, for each layer, a next partition is installed next to the bottom tabs of the previous partition until all partitions of the layer have been installed. Storage devices are used herein merely as an example, but the assembled cage can be used for holding other types of computer components.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An apparatus for holding computer components comprising:
    a plurality of cage panels including a first cage panel and a second cage panel; and
    a plurality of partitions, wherein a respective partition in the plurality of partitions includes:

a body with a first side and a second side, the first and second sides of the body being part of a same continuous piece of material, wherein the first and second sides have inner surfaces that face each other, wherein the inner surface of the first side is separated from the inner surface of the second side by a width;

one or more top tabs projecting from both the first side and the second side of the body;

one or more bottom tabs projecting from the first side of the body;

one or more bottom protrusions projecting from the second side of the body, wherein the one or more top tabs are secured in a first manner to the first cage panel, the one or more bottom tabs are secured in the first manner to the second cage panel, and the one or more bottom protrusions are secured in a second manner to the second cage panel of the apparatus, wherein the first manner is different from the second manner; and one or more pairs of side contours, wherein each pair includes: a first side contour extending from the first side of the body, and a second side contour extending from the second side of the body, wherein the first and second side contours provide additional contact points between the inner surfaces of the first and second sides of the body, wherein the first and second sides of the body join to form a U-shaped profile.

2. The apparatus of claim 1, wherein a respective bottom tab of the one or more bottom tabs includes a hole for securing the respective bottom tab to the second cage panel, the hole facilitating securing the respective bottom tab to the second cage panel in the first manner.

3. The apparatus of claim 1, wherein the first manner includes securing the one or more top tabs and the one or more bottom tabs using rivets.

4. The apparatus of claim 1, wherein the second manner includes tucking a respective bottom protrusion of the one or more protrusions under a portion of the second cage panel.

5. The apparatus of claim 1, wherein a respective partition in the plurality of partitions further includes one or more vents, wherein at least one of the one or more vents have a polygonal shape or a circular shape.

6. The apparatus of claim 1, wherein each of the one or more side contours facilitates airflow between the first side of the body and the second side of the body such that air flows through at least one of the one or more side contours, wherein the width is greater than or equal to 3 millimeters.

7. An apparatus for holding computer components comprising:

a plurality of cage panels including a first cage panel and a second cage panel; and a plurality of partitions, wherein a respective partition in the plurality of partitions includes:

a body with a first side and a second side, the first and second sides having inner surfaces that face each other, wherein the inner surface of the first side is separated from the inner surface of the second side by a width of at least 3 millimeters measured in a direction perpendicular to the first and second sides of the body, wherein the first and second sides of the body are part of a same continuous piece of material;

one or more top tabs projecting from both the first side and the second side of the body;

one or more bottom tabs projecting from the first side of the body;

one or more bottom protrusions projecting from the second side of the body, wherein the one or more top tabs are secured in a first manner to the first cage panel, the one or more bottom tabs are secured in the first manner to the second cage panel, and the one or more bottom protrusions are secured in a second manner to the second cage panel of the apparatus, wherein the first manner is different from the second manner; and one or more pairs of side contours, wherein each pair includes: a first side contour extending from the first side of the body, and a second side contour extending from the second side of the body, wherein the first and second side contours provide additional contact points between the inner surfaces of the first and second sides of the body, wherein the first and second sides of the body join to form a U-shaped profile.

8. The apparatus of claim 7, wherein the first cage panel and the second cage panel are separated by the plurality of partitions.

9. The apparatus of claim 7, wherein:

the plurality of cage panels further includes a third cage panel;

the plurality of partitions is arranged in a first row and a second row;

the first row is defined by the first cage panel and the second cage panel; and the second row is defined by the second cage panel and the third cage panel.

10. The apparatus of claim 7, wherein a respective bottom tab of the one or more bottom tabs in the respective partition includes a hole for securing the respective bottom tab to the second cage panel, the hole facilitating securing the respective bottom tab to the second cage panel in the first manner.

11. The apparatus of claim 7, wherein the second manner includes tucking a respective bottom protrusion of the one or more protrusions in the respective partition under a portion of the second cage panel.

12. The apparatus of claim 7, wherein the respective partition further comprises one or more vents, at least one of the vents having a polygonal shape or a circular shape.

13. The apparatus of claim 7, wherein each of the one or more side contours facilitates airflow between the first side of the body and the second side of the body, such that air flows across the width through at least one of the one or more side contours.

14. The apparatus of claim 7, further comprising:

first and second bumpers positioned on an outer surface of the first side, the outer surface of the first side being opposite the inner surface of the first side; and third and fourth bumpers positioned on an outer surface of the second side, the outer surface of the second side being opposite the inner surface of the second side.

* * * * *